(12) United States Patent
Shih

(10) Patent No.: US 10,191,912 B2
(45) Date of Patent: Jan. 29, 2019

(54) SHARED DECOMPRESSION ENGINE

(71) Applicant: Oracle International Corporation, Redwood Shores, CA (US)

(72) Inventor: Milton Shih, Westford, MA (US)

(73) Assignee: Oracle International Corporation, Redwood Shores, CA (US)

( * ) Notice: Subject to any disclaimer, the term of this patent is extended or adjusted under 35 U.S.C. 154(b) by 307 days.

(21) Appl. No.: 15/042,662

(22) Filed: Feb. 12, 2016

(65) Prior Publication Data

US 2017/0235752 A1    Aug. 17, 2017

(51) Int. Cl.
*G06F 17/30* (2006.01)
*H03M 7/30* (2006.01)

(52) U.S. Cl.
CPC .... *G06F 17/30153* (2013.01); *G06F 17/3007* (2013.01); *H03M 7/30* (2013.01); *H03M 7/3084* (2013.01)

(58) Field of Classification Search
USPC ....... 707/608, 692, 687, 964, 640, 661, 705, 707/813, 821
See application file for complete search history.

(56) References Cited

U.S. PATENT DOCUMENTS

| | | | |
|---|---|---|---|
| 6,614,428 B1 * | 9/2003 | Lengyel | G06T 9/001 345/420 |
| 7,496,586 B1 | 2/2009 | Bonwick et al. | |
| 2014/0269919 A1 * | 9/2014 | Rodriguez | H04N 19/513 375/240.16 |

* cited by examiner

*Primary Examiner* — Sana A Al-Hashemi
(74) *Attorney, Agent, or Firm* — Ferguson Braswell Fraser Kubasta PC

(57) ABSTRACT

A method for sharing a hardware decompression engine, including performing a compression type check on a first data stream to determine a compression type of the first data stream, wherein the first data stream is compressed using one selected from a group consisting of a first compression type and a second compression type; wherein, when the first data stream is compressed with the second compression type: receiving the second compression type at a selector; converting the first data stream compressed with the second compression type into a second data stream of the first compression type; inputting the converted second data stream into the selector; and decompressing the converted second data stream using the hardware decompression engine capable of decompressing a data stream compressed using the first compression type. In other aspects, a system for sharing a hardware decompression engine and a computing system are provided.

10 Claims, 4 Drawing Sheets

SHARED DECOMPRESSION ENGINE

BACKGROUND

Files are stored by operating systems as compressed files or as uncompressed files. A compressed file characteristically requires less storage space than an uncompressed file. Compression of files is typically done with a compression algorithm, such as a GNU (Gnu Not Unix) ZIP (GZIP) compression algorithm or a Lempel Ziv Jeff Bonwick (LZJB) compression algorithm. These compression/decompression algorithms are also referred to as simply GZIP or LZJB compression/decompression algorithms or as GZIP or LZJB compression/decompression types. Dependent on the operating system used, the user may be able to choose whether to use a compression algorithm, and if so, which compression algorithm is to be used. Further, the user may be able to choose the compression algorithm on a per file type basis. Compression/decompression of files can be done in software or in hardware. In the former case, the compression/decompression is also referred to as software-assisted compression/decompression or simply as software compression/decompression.

Software compression/decompression requires a relatively long amount of time to complete and utilizes additional computing resources of the processor. In contrast, hardware compression/decompression is provided, for example, on the same die as the processor or as a separate add-on card for a computing system. In both cases, the physical devices to perform hardware compression/decompression are also referred to as hardware compression/decompression engines or as compression/decompression hardware accelerators. Hardware compression/decompression, when compared to software compression/decompression, generally requires a smaller amount of time to complete and requires less processor resources but at an additional cost. For example, the processor die area on a silicon wafer is at a premium and adding one or more hardware compression/decompression accelerators to the processor die requires additional die area. Similarly, the add-on card with one or more hardware compression/decompression accelerators invokes an additional cost to the computing system. In that respect, it may be beneficial to explore how compression/decompression requirements may be advantageously satisfied while minimizing costs.

SUMMARY

In general, in one aspect, one or more embodiments disclosed herein relate to a method for sharing a hardware decompression engine, including performing a compression type check on a first data stream to determine a compression type of the first data stream, wherein the first data stream is compressed using one selected from a group consisting of a first compression type and a second compression type; wherein, when the first data stream is compressed with the second compression type: receiving the second compression type at a selector; converting the first data stream compressed with the second compression type into a second data stream of the first compression type; inputting the converted second data stream into the selector; and decompressing the converted second data stream using the hardware decompression engine capable of decompressing a data stream compressed using the first compression type.

In another aspect, one or more embodiments disclosed herein relate to a system for sharing a hardware decompression engine, the system including a selector configured to receive as an input, a selection of a first or a second compression type of a first data stream; a decoder, wherein, when the second compression type of the first data stream is received as the input to the selector, the decoder is configured to receive and decode a first data stream compressed with the second compression type and to generate an indicator, a first information, and a second information; a control byte generator, configured to receive the indicator and to generate a control information; a format circuit configured to format the control information, the first information, and the second information into a second data stream of the first compression type; and a decompression circuit of the first compression type, wherein, when the second compression type of the first data stream is received as the input to the selector, the decompression circuit is configured to decompress the second data stream of the first compression type converted from the second compression type of the first data stream.

In yet another aspect, one or more embodiments disclosed herein relate to a computing system for decompressing a stream, the computing system including a processor; a hardware decompression engine configured to decompress a data stream compressed using a first compression type, wherein the hardware decompression engine resides on the same die as the processor; a memory; a storage device; and software instructions stored in the memory for enabling the computer system under control of the processor, to: perform a compression type check on a first data stream to determine a compression type of the first data stream, wherein the first data stream is compressed using one selected from a group consisting of a first compression type and a second compression type; wherein, when the first data stream is compressed with the second compression type: convert the first data stream compressed with the second compression type into a second data stream using the first compression type; and decompress the converted second data stream using the hardware decompression engine capable of decompressing a data stream compressed using the first compression type.

Other aspects of the disclosure will be apparent from the following description and the appended claims.

DETAILED DESCRIPTION

Figure 1:
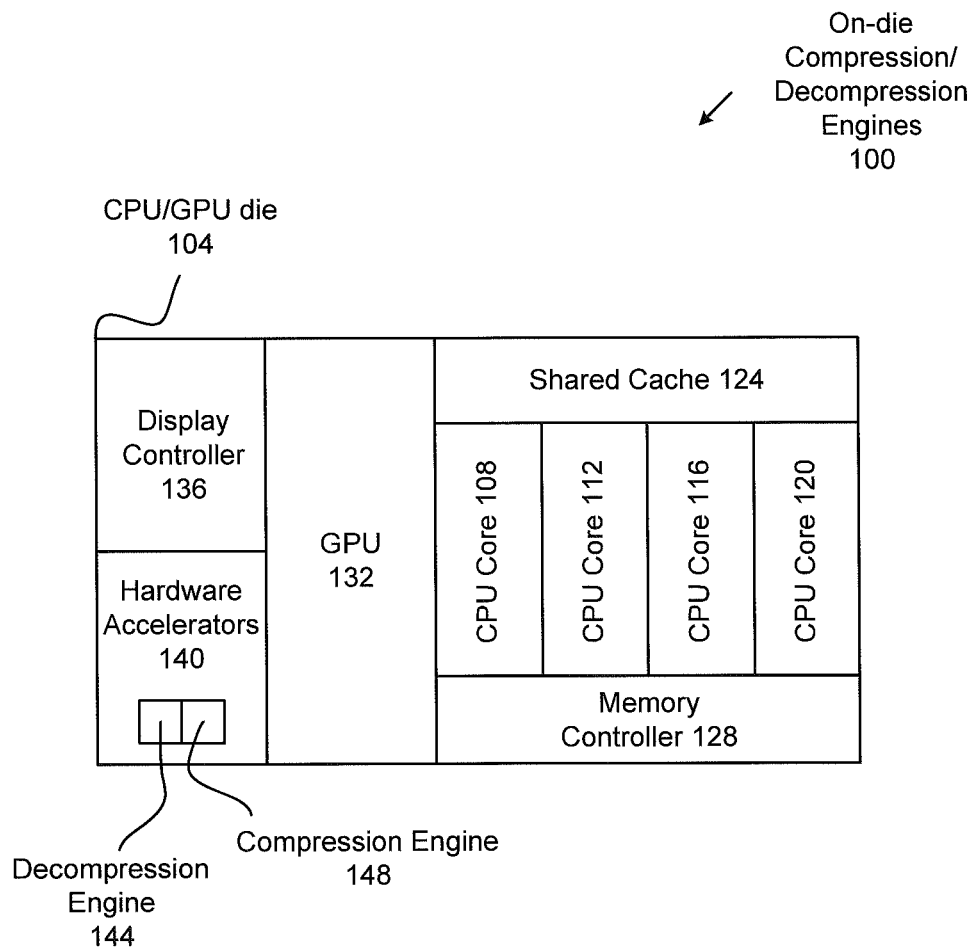
FIG. 1 shows a schematic diagram of on-die compression and decompression engines among other hardware accelerators in accordance with one or more embodiments.

Specific embodiments will now be described with reference to the accompanying figures. In the following detailed description, numerous specific details are set forth in order to provide a more thorough understanding of the disclosure. However, it will be apparent to one of ordinary skill in the art that embodiments may be practiced without these specific details. In other instances, well-known features have not been described in detail to avoid unnecessarily complicating the description.

Throughout the disclosure, certain specific terms will be used to describe elements or functionality of one or more embodiments. However, other terms may be likewise used to describe the same elements or functionality of one or more embodiments. For example, the terms "hardware compression engine" and "hardware decompression engine" are also referred to as "hardware compression accelerator" and "hardware decompression accelerator" or as "compression circuit" and "decompression circuit." Similarly, the term compression/decompression "algorithm" is also referred to as compression/decompression "type" or compression/decompression "format." Further, the term "processor" is also referred to as "Central Processing Unit (CPU)" or "Graphics Processing Unit (GPU)" or "CPU/GPU" or "Computing Unit" or System-on-a-Chip (SoC). In addition, the term "compressed file" and "decompressed file" are also referred to as "compressed data stream" or "decompressed data stream." Further, the term single "die" is also referred to as a single "chip."

In general, embodiments of the present disclosure relate to cost-effective sharing of a hardware decompression engine. Such cost-effectiveness may be achieved by determining the compression type of a file to be decompressed. If the compression type of the file is already of the same type as the hardware decompression engine, then the hardware decompression engine may be used directly. However, if the compression type of the file is of a different type than the hardware decompression engine, then the file may need to be converted to the same type which the decompression engine supports. Accordingly, the present disclosure relates to advantageously utilizing the same type of hardware decompression engine for files, even if the files are of differing compression types.

Further, embodiments of the present disclosure relate to a shared hardware decompression engine which may be implemented as part of a system-on-a-chip (SoC). SoC generally refers to an integrated circuit which is located on a single die (chip), e.g., a silicon die. The single die may be obtained from dicing a semiconductor wafer, e.g., a silicon wafer, which has undergone wafer processing. The integrated circuit on the single die may contain a variety of components and component groups, among them analog circuits, digital circuits, mixed signal circuits (a combination of analog and digital circuits), and others.

While in some embodiments, the shared hardware decompression engine may be implemented as part of a SoC, in other embodiments, the shared hardware decompression engine may be implemented as a part of a system-in-a-package (SiP). A SiP generally refers to several dies (chips) which have been assembled into a single package. The several dies may be stacked onto each other or may be adjacent to each other. Yet in other embodiments, the shared hardware decompression engine may be implemented partly or fully in a field-programmable gate array (FPGA).

In one or more embodiments of the present disclosure, the integrated circuit may be a CPU, a GPU, or a combination thereof. The integrated circuit may be used in desktops, laptops, notebooks, workstations, gaming consoles, and in other systems. In one or more embodiments, the integrated circuit may be operatively connected with a motherboard. However, the present disclosure is not limited to these particular embodiments. Specifically, the present disclosure for the shared hardware decompression engine is applicable to any system, which is configured with a hardware decompression engine of at least one type.

FIG. 1 shows a schematic diagram 100 of on-die compression and decompression engines among other hardware accelerators in accordance with one or more embodiments. In FIG. 1, element 104 depicts a single CPU/GPU die with four CPU cores 108, 112, 116, and 120, each of which may execute program instructions. The decision regarding which particular CPU core executes instructions by a particular program or application may be controlled by the operating system. The CPU cores 108, 112, 116, and 120 are configured to have access to a shared cache 124. The shared cache 124 may contain a portion of program data that has been copied from the system memory (not shown). Therefore, the use of cache may reduce the time needed for a CPU core to access program data. The shared cache 124 may be configured to be shared among the CPU cores 108, 112, 116, and 120.

In FIG. 1, a GPU 132 is also located on the die to create and manipulate a frame buffer from which data may be sent to an output device, such as a display (not shown). Further, a memory controller 128 and a display controller 136 are shown. The memory controller 128 allows the CPU cores to access system memory to retrieve or store program data. As shown in FIG. 1, in one or more embodiments, the memory controller may be residing on the same die as the CPU/GPU die 104. In other embodiments, the memory controller 128 may be residing on a different die.

The display controller 136 in FIG. 1 may receive frame buffer data from the GPU and is configured to output the data into VGA (Video Graphics Array), HDMI (High-Definition Multimedia Interface), DVI (Digital Visual Interface), or DP (Display Port) interfaces to be displayed on a corresponding display (not shown). However, one skilled in the art would appreciate that the display controller 136 may output data into other display interfaces.

The CPU/GPU die 104 in FIG. 1 may also contain hardware accelerators 140, which support various video or audio encoders/decoders (codecs). A decompression engine 144 and a compression engine 148 are located near the hardware accelerators 140. In one or more embodiments, the decompression engine 144 is a shared LZJB decompression engine and the compression engine 148 is an LZJB compression engine. In the same embodiments, the shared LZJB decompression engine may be configured to decompress a file which has been previously compressed with an LZJB compression algorithm. Further, in the same embodiments, the shared LZJB decompression engine may also be configured to decompress a file which has been previously compressed with a GZIP compression algorithm and which has been converted into a compressed LZJB data stream. Accordingly, a shared LZJB hardware decompression engine may be configured to decompress an LZJB-compressed file or a GZIP-compressed file in these embodiments.

One skilled in the art would appreciate that other embodiments may utilize a shared hardware decompression algorithm of a different type. For example, the shared hardware decompression engine may be configured to be of the GZIP, LZ77, LZJB, LZW (Lempel-Ziv-Welch), LZSS (Lempel-Ziv-Storer-Szymanski), LZMA (Lempel-Ziv-Markov), or of another type. Further, one skilled in the art would appreciate that the shared hardware decompression engine may be configured to decompress a variety of other compression types as long as the other compression types are converted beforehand into the compression type which the shared hardware decompression engine is configured for.

Further, one skilled in the art would appreciate that the decompression engine 144 and the compression engine 148 may also be located at different locations on the CPU/GPU die 104 to opportunistically benefit from proximity to relevant signals or as a result of "floor planning" to minimize the required area of the CPU/GPU die 104. Further, one of ordinary skill in the art would appreciate and understand that the number of CPU cores or the size or capability of the GPU 132 may be changed in FIG. 1. Accordingly, arrangements other than the one shown in FIG. 1 may be contemplated without departing from the scope of the invention. In addition, elements not shown in FIG. 1 may be added to the CPU/GPU die 104 without departing from the scope of the disclosure.

Figure 2:
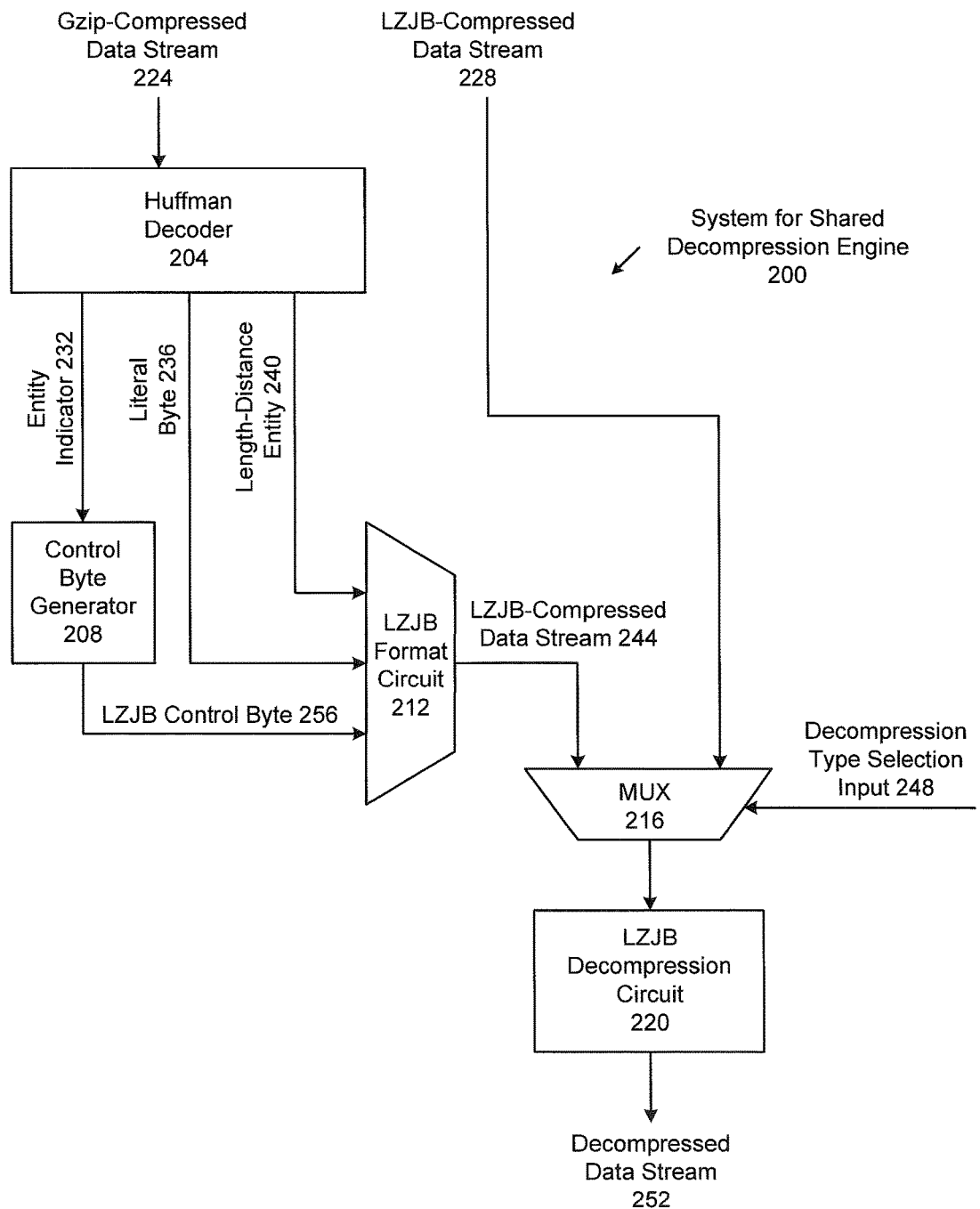
FIG. 2 shows a system for a shared decompression engine in accordance with one or more embodiments.

Referring now to FIG. 2, FIG. 2 illustrates a system 200 for a shared decompression engine. In the embodiment in FIG. 2, an LZJB-compressed data stream 228 (a first data stream of a first compression type) and a GZIP-compressed data stream 224 (a first data stream of a second compression type) are shown. The LZJB-compressed data stream 228 in FIG. 2 is input into a multiplexer (MUX) 216. The GZIP-compressed data stream 224 is input to a Huffman decoder 204. The Huffman decoder 204 has a plurality of outputs, specifically, the entity indicator 232, the literal byte 236 (first information), and the length-distance entity 240 (second information). The entity indicator 232 is input to a control byte generator 208, which in turn, has an LZJB control byte 256 (control information) as an output. One skilled in the art will appreciate that the number of entity indicator(s) 232, the number of LZJB control byte(s) 256, the number of literal byte(s) 236, and the number of length-distance entity(ies) 240 naturally depends on the size of the file to be decompressed.

The LZJB control byte 256, the literal byte 236, and the length-distance entity 240 are input to a functional LZJB format circuit 212 (a format circuit of a second compression type). The functional LZJB format circuit 212 may include memory to store incoming entities, e.g., literal bytes 236 and length-distance entities 240. The output of the functional LZJB format circuit 212 is an LZJB-compressed data stream 244 (a second data stream of a first compression type) which is also input to the MUX 216, described above. The MUX 216 has a decompression type selection input 248 and provides an output to an LZJB decompression circuit 220. One skilled in the art will appreciate that the MUX 216 may act as an input selector based on the decompression type selection input 248. Specifically, dependent on whether the input value of the decompression type selector 248 is high or low, the MUX 216 outputs either the LZJB-compressed data stream 228 or the LZJB-compressed data stream 244 to the LZJB decompression circuit 220. The LZJB decompression circuit 220 has a decompressed data stream 252 as an output. Accordingly, dependent on the decompression type selector 248, the decompressed data stream 252 is derived from either the LZJB-compressed data stream 228 or the LZJB-compressed data stream 244.

Embodiments of the system 200 for the shared decompression engine in FIG. 2 may be implemented on the processor die. Alternatively, the system 200 for the shared decompression engine may be implemented on another die, which is separate from the processor die. In other embodiments, the system 200 for the shared decompression engine in FIG. 2 may be realized as a combination of hardware and software. Further, while the embodiment in FIG. 2 is shown with the Huffman decoder 204, one skilled in the art will appreciate that the Huffman decoder 204 is used specifically for the GZIP-compressed data stream 224.

However, the present disclosure is not limited to exploiting the commonality of an LZJB decompression circuit 220 to decompress data streams of the GZIP-compressed data stream 224 and the LZJB-compressed data stream 228. Other commonalities of compression types may be exploited using the same decompression engine. Accordingly, one skilled in the art will appreciate that the shared decompression of other compression types may require other decoders and/or other conversion circuitry to convert one compression type into another compression type that can be commonly decompressed by a shared decompression engine. Therefore, the present disclosure is not limited to a shared LZJB decompression engine and consequently, other embodiments may use a shared decompression engine of a different type.

Figure 3:
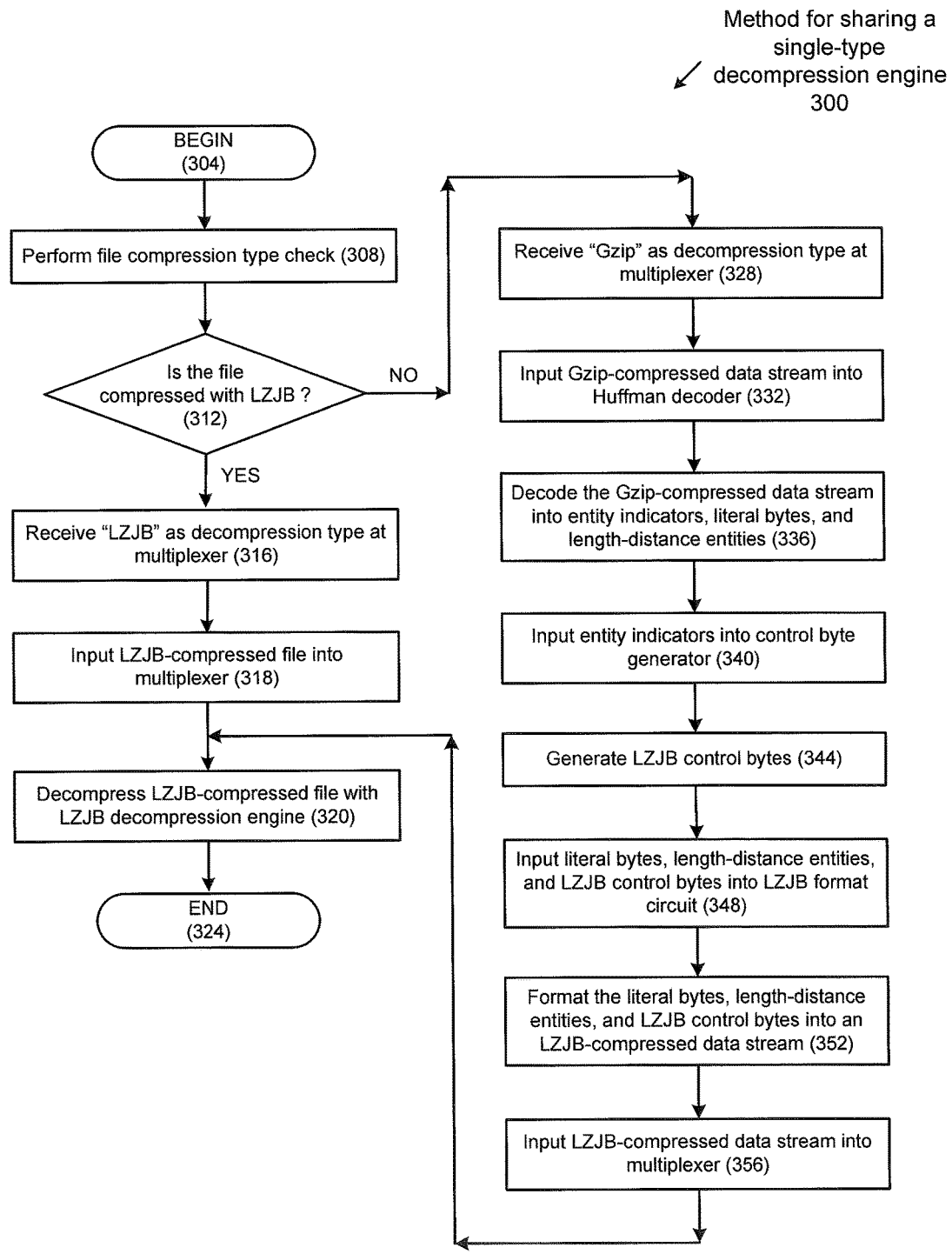
FIG. 3 shows a method for sharing a single-type decompression engine in accordance with one or more embodiments.

FIG. 3 illustrates a flowchart for a method 300 for sharing a single-type decompression engine in accordance with one or more embodiments. Specifically, the method for sharing a single-type decompression engine starts at 304. At 308, a check is performed to determine which compression type the file is compressed with. If the determination is made at 312 that the file is compressed with the LZJB algorithm (a first compression type), the method continues to 316 at which "LZJB" is received as decompression type selection input at a multiplexer (MUX). Subsequently, the LZJB-compressed file is input into the LZJB decompression engine at 318 and the LZJB-compressed file is decompressed at 320 with the LZJB decompression engine. Once the file has been decompressed at 320, the method ends at 324.

In one or more embodiments, the determination of the compression type of the file may be done by software. Specifically, an operating system of a computing system may provide the user a plurality of choices regarding which compression type to use. In one or more embodiments, the operating system may provide the choice between LZJB and GZIP compression. One of the LZJB and GZIP compression types may be selected as default compression type by the operating system when the user has not selected an alternate compression type. In other embodiments, the operating system may provide choices according to other compression algorithms. Accordingly, the operating system is "aware" of the default compression type or the user selected compression type and may store this information along with the file name and the file type, e.g., in a file table.

In other embodiments, the determination of the compression type of the file may be done by hardware. Specifically, different file types, e.g., PDF files, GZIP-compressed files, etc., typically begin with a unique sequence of bytes that identify the type of file that follows the unique sequence of bytes. These bytes are also referred to as "magic number." Accordingly, in one or more embodiments, hardware may identify the type of a file by reading the first several bytes of the file. Subsequently, a comparator circuit may compare the read first several bytes to an internal lookup table that maps different values of bytes (i.e., a list of known magic numbers) into their corresponding file format type. By way of an example, GZIP files begin with bytes corresponding to the hexadecimal value 0x1F8B and any file beginning with this magic number may be classified as a GZIP-compressed file by the hardware. However, the determination of the compression type of the file is not limited to software or hardware and combinations of software and hardware may be used without departing from the scope of the disclosure.

However, if the determination is made at 312 that the file is not compressed with the LZJB algorithm, then the method proceeds to 328 at which "GZIP" (a second compression type) is received as decompression type selection input at the MUX. Subsequently, the GZIP-compressed data stream is input to a Huffman decoder at 332 and the GZIP-compressed data stream is decoded into entity indicators, literal bytes (a first information), and length-distance entities (a second information) at 336. The method then proceeds to 340 at which the entity indicators are input to a control byte generator. At 344, LZJB control bytes are generated from the entity indicators and the literal bytes, length-distance entities, and LZJB control bytes are input into a functional LZJB format circuit at 348. The method continues at 352 at which the literal bytes, length-distance entities, and LZJB control bytes are formatted into an LZJB-compressed data stream. Specifically, when eight literal bytes or length-distance entities have been received, the functional LZJB format circuit outputs a single control byte followed by the eight entities in the same order they were received. Further, each bit of the control byte indicates whether the corresponding entity is a literal entity or a length-distance entity. In addition, another control byte is output by the functional LZJB format circuit once eight more entities have been received, followed by the entities themselves. Accordingly, at 352, the control bytes and entities are output as LZJB-compressed data stream until the end of the GZIP-compressed data stream of the file is reached.

The portion of the flowchart in FIG. 3 represented by 332, 336, 340, 344, 348, and 352 may also be referred to as conversion of the GZIP-compressed data stream into an LZJB-compressed data stream. After 352, the method then proceeds to input the LZJB-compressed data stream into the MUX at 356. Subsequently, the LZJB-compressed data stream is decompressed with the LZJB decompression engine at 320. Once the data stream has been decompressed at 320, the method ends at 324.

However, the present disclosure is not limited to the embodiment described with respect to the method flowchart in FIG. 3. One of ordinary skill in the art would appreciate that the method 300 of sharing a single-type decompression engine could be realized differently. For example, in the embodiment described in FIG. 3, it is assumed during the file compression type check 308 that the file is either compressed with the LZJB algorithm or with the GZIP algorithm. However, one skilled in the art will appreciate that other embodiments may make other assumptions. For example, the file compression type check in other embodiments may assume more than two compression algorithms and the flowchart for those embodiments will appropriately select necessary actions to convert the identified compression type into the compression type that the single-type decompression engine is able to decompress.

In one or more embodiments, the system for sharing a hardware decompression engine includes hardware (e.g., circuitry), software, firmware, or any combination thereof, that includes functionality to perform at least some functions described herein in accordance with one or more embodiments of the present disclosure. In one or more embodiments, the system for sharing a hardware decompression engine of the present disclosure is, at least in part, a software application, or a portion thereof, written in any programming language that includes instructions stored on a non-transitory computer readable medium which, when executed by one or more processors in a computing device, enable the computing device to perform the functions described in accordance with one or more embodiments of the disclosure.

Further, one or more embodiments of the present disclosure may be implemented for the decompression of files into the file system (100) in FIG. 1 of U.S. Pat. No. 7,496,586, which is incorporated herein by reference in its entirety.

In addition, one or more embodiments may be implemented for the decompression of streams. In one or more embodiments, the streams may be a flow of data encoded by logical zeros or ones. In other embodiments, the streams may be encoded in a different manner. In one or more embodiments, the streams may be representing data from a file, streaming audio, streaming video, or web data. However, in yet further embodiments, the streams may represent other data without departing from the scope of the disclosure.

Figure 4:
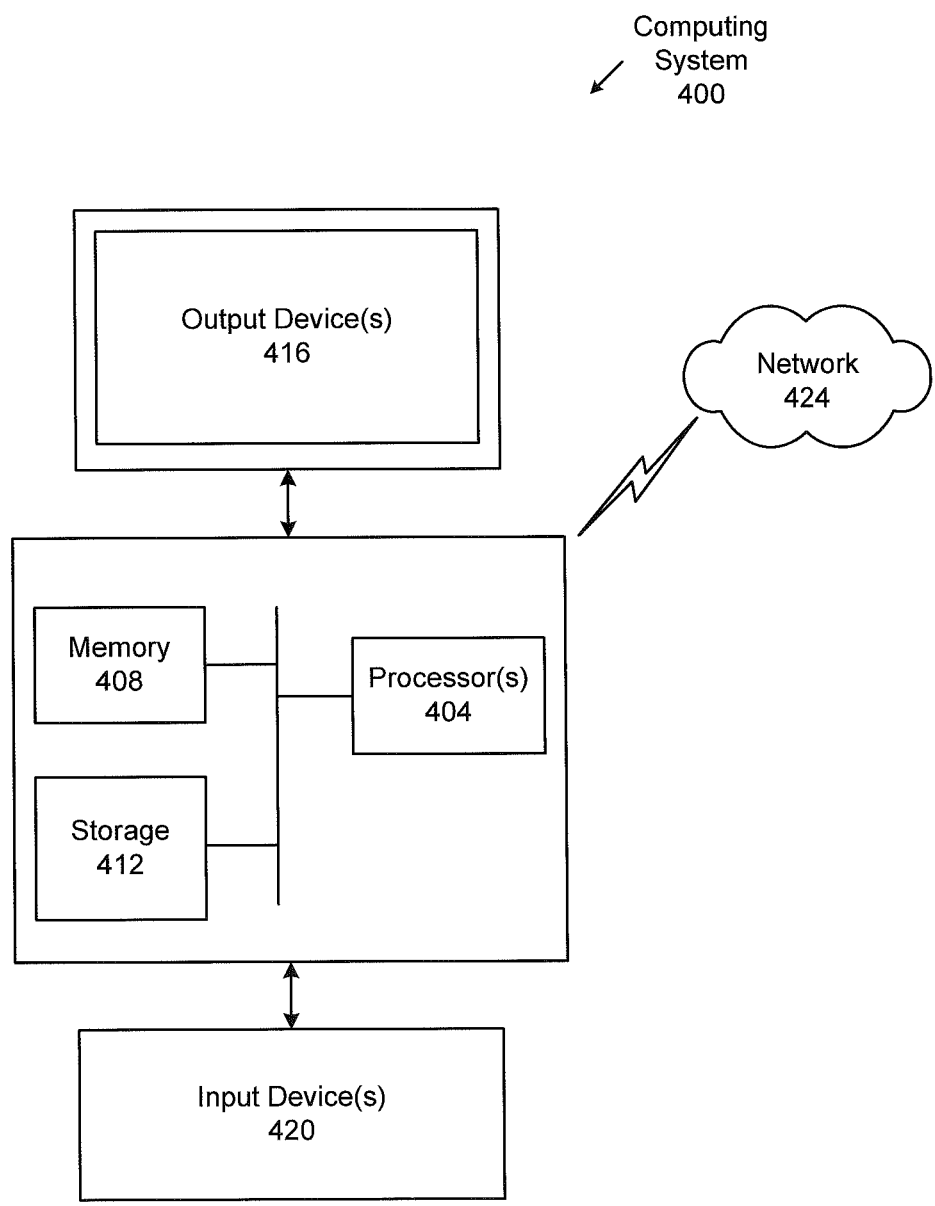
FIG. 4 shows a computing system in accordance with one or more embodiments.

One or more embodiments of the present disclosure may be implemented on virtually any type of computing system, regardless of the platform being used. In one or more embodiments, the computing system may be an embedded microcontroller with one or more microprocessors. For example, as shown in FIG. 4, the computing system (400) may include one or more processor(s) (404), associated memory (408) (e.g., random access memory (RAM), cache memory, flash memory, etc.), one or more storage device(s) (412) (e.g., a hard disk, an optical drive such as a compact disc (CD) drive or digital versatile disc (DVD) drive, a flash memory stick, a solid state drive (SSD), etc.), and numerous other elements and functionalities. The processor(s) (404) may be an integrated circuit for processing instructions. For example, the processor(s) may be one or more cores, or micro-cores of a processor. The computing system (400) may also include one or more input device(s) (420), such as a touchscreen, keyboard, mouse, microphone, touchpad, electronic pen, or any other type of input device.

Further, the computing system (400) may include one or more output device(s) (416), such as a screen (e.g., a liquid crystal display (LCD), a plasma display, touchscreen, projector, or other display device), a printer, external storage, or any other output device. One or more of the output device(s) may be the same or different from the input device(s). The computing system (400) may be connected to a network (424) (e.g., a local area network (LAN), a wide area network (WAN) such as the Internet, mobile network, or any other type of network) via a network interface connection (not shown). The input and output device(s) may be locally or remotely (e.g., via the network (424)) connected to the processor(s) (404), memory (408), and storage device(s) (412). Many different types of embedded and non-embedded computing systems exist, and the aforementioned input and output device(s) may take other forms. In one or more embodiments, the computing system may be a headless system, e.g. no input devices 420 and/or no output devices 416 may be utilized.

Software instructions in the form of computer readable program code to perform embodiments may be stored, in whole or in part, temporarily or permanently, on the non-transitory computer readable medium. Such non-transitory computer readable medium maybe an erasable programmable read only memory (EPROM), a flash memory, an internal or external storage device, a DVD, a CD, or any other computer or embedded microcontroller readable storage medium. Specifically, the software instructions may correspond to computer readable program code or embedded microcontroller readable program code that when executed by a processor(s), is configured to perform embodiments of the disclosure. In addition, the software instructions and the associated non-transitory computer readable medium may also be referred to as firmware. In one or more embodiments, the firmware may be updated.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

What is claimed is:

1. A method comprising:

receiving a first selection of a second compression type at a selector that is connected to a format circuit and a decompression circuit and is configured to receive a selection between a first compression type and the second compression type;

in response to receiving the first selection, converting a first data stream compressed with the second compression type into a second data stream of the first compression type by:

decoding the first data stream into entity indicators, literal bytes, and length-distance entities with a decoder that is connected to a control byte generator and the format circuit, generating control bytes from the entity indicators with the control byte generator, which is connected to the decoder and the format circuit, inputting the control bytes, the literal bytes, and the length-distance entities into the format circuit, which is connected to the decoder, the control byte generator, and the selector, and formatting the control bytes, the literal bytes, and the length-distance entities into the second data stream of the first compression type with the format circuit;

inputting the second data stream into the selector; and decompressing the second data stream using the decompression circuit, which is connected to the selector and is capable of decompressing a data stream compressed using the first compression type.

2. A system comprising:

a selector, which is connected to a format circuit and a decompression circuit and is configured to receive as an input, a selection between a first compression type and a second compression type;

a decoder, which is connected to a control byte generator and the format circuit and is configured to, when the second compression type is received as the input to the selector, receive and decode a first data stream compressed with the second compression type and to generate entity indicators, literal bytes, and length-distance entities;

the control byte generator, which is connected to the decoder and the format circuit and is configured to receive the entity indicators and to generate control bytes;

the format circuit, which is connected to the decoder, the control byte generator, and the selector and is configured to format the control bytes, the literal bytes, and the length-distance entities into a second data stream of the first compression type; and the decompression circuit, which is connected to the selector, is of the first compression type, and is configured to, when the second compression type is received as the input to the selector, decompress the second data stream of the first compression type converted from the second compression type of the first data stream.

3. A computing system comprising:

a processor;

a selector, which is connected to a format circuit and a decompression circuit, wherein the decompression circuit is connected to the selector and is configured to decompress a data stream compressed using a first compression type, and wherein the decompression circuit resides on the same die as the processor;

a decoder, which is connected to a control byte generator and a format circuit, wherein the control byte generator is connected to the decoder and the format circuit, and wherein the format circuit is connected to the decoder, the control byte generator, and the selector;

a memory;

a storage device; and software instructions stored in the memory for enabling the computer system under control of the processor, to:

receive a selection of a second compression type at the selector configured to receive a selection between the first compression type and the second compression type;

in response to receiving the selection, convert the first data stream compressed with the second compression type into a second data stream using the first compression type by:

decoding the first data stream with the decoder into entity indicators, literal bytes, and length-distance entities, generating control bytes from the entity indicators with a control byte generator, inputting the control bytes, the literal bytes, and the length-distance entities into the format circuit, and formatting the control bytes, the literal bytes, and the length-distance entities into the second data stream of the first compression type with the format circuit; and decompress the second data stream using the decompression circuit.

4. The method according to claim 1, further comprising:

receiving a second selection of the first compression type at the selector;

in response to receiving the second selection, inputting a third data stream compressed with the first compression type into the selector; and decompressing the third data stream of the first compression type with the decompression circuit capable of decompressing a data stream compressed using the first compression type.

5. The method according to claim 1, wherein the first compression type comprises a Lempel Ziv Jeff Bonwick (LZJB) compression algorithm.

6. The method according to claim 1, wherein the second compression type comprises a GNU (Gnu Not Unix) ZIP (GZIP) compression algorithm.

7. The method according to claim 1, wherein the control bytes comprise a Lempel Ziv Jeff Bonwick (LZJB) control byte.

8. The system according to claim 2, wherein the system is implemented on a single die.

9. The system according to claim 2, wherein the decoder comprises a Huffman decoder.

10. The system according to claim 2, wherein the decompression circuit comprises hardware decompression according to a Lempel Ziv Jeff Bonwick (LZJB) decompression algorithm.

* * * * *